United States Patent [19]

Prasad

[11] 3,981,724

[45] Sept. 21, 1976

[54] ELECTRICALLY CONDUCTIVE ALLOY

[75] Inventor: Janniah S. Prasad, Norwalk, Conn.

[73] Assignee: Consolidated Refining Company, Inc., Mamaroneck, N.Y.

[22] Filed: Nov. 6, 1974

[21] Appl. No.: 521,393

[52] U.S. Cl. ............................................. 75/173 R
[51] Int. Cl.² ........................................... C22C 5/06
[58] Field of Search .................................. 75/173 R

[56] References Cited
UNITED STATES PATENTS

| | | | |
|---|---|---|---|
| 1,970,084 | 8/1934 | Feussner | 75/173 R |
| 3,310,718 | 3/1967 | Lupfer | 317/258 |
| 3,788,833 | 1/1974 | Short | 75/.5 A |

Primary Examiner—L. Dewayne Rutledge
Assistant Examiner—E. L. Weise
Attorney, Agent, or Firm—Amster & Rothstein

[57] ABSTRACT

An alloy comprising silver plus one or more additives taken from the class consisting of gold, platinum, osmium, iridium, palladium, ruthenium and rhodium is disclosed. Each additive metal is present in an amount of from 0 to 1% by weight of the alloy. The total amount of additive is at least 0.05% by weight of the alloy. A method of making permanent electrical connections using the alloy is also disclosed.

1 Claim, No Drawings

ELECTRICALLY CONDUCTIVE ALLOY

The present invention is directed to a new alloy primarily intended for interconnection lead bonding in solid state devices.

Due to the enormous growth of the use of solid state devices for military and commercial applications in recent years, a need for better materials for interconnecting the various elements in solid state circuitry has arisen. Previously gold and aluminum alloys have been used for this purpose.

When gold is used it is typically 99.99% pure. It has excellent resistance to corrosion and has good electrical properties. However, the cost of this metal, particularly in recent times, is and has been a major disadvantage. This becomes even more important in the light of the present demand for solid state devices at low prices without the sacrifice of quality and/or reliability.

It has been found that by alloying silver with comparatively small amounts of certain other metals, an alloy having uniquely desirable properties is obtained. More specifically, there is added to silver at least one additive taken from the class consisting of the metals gold, rhodium, ruthenium, palladium, osmium, iridium and platinum. Each additive metal present is in an amount of from 0 to 1% by weight of the alloy and the total amount of additive is at least 0.05% by weight of the alloy.

The elements gold, platinum and palladium have been found to be especially suitable and the elements gold and platinum jointly are still further preferred. It is most desirable to use from 0.1 to 0.5% by weight based on the alloy of each of the metals which is added to the silver. However, for best results there should not be more than 2% by weight based on the alloy of the total additives and more preferably, no more than 1% of such additives.

A typical alloy is made by placing 0.05 troy ounces of gold and an equal amount of platinum in a crucible to which is also added 9.9 troy ounces of silver. The crucible is then placed in an induction furnace and heated to about 2,000°F. When all of the metals are molten the liquid alloy is cast into an ingot mold and allowed to cool and solidify. The resultant alloy is then drawn into wire approximately 0.001 inch in diameter. Such wire has been found very useful and suitable for permanent connections between solid state and similar electrical and electronic elements.

By keeping the level of additions low it is possible to obtain numerous desirable characteristics with a minimum of negative effects. For example, the alloys of the present invention inhibit the undesirable metal migration tendency of silver. This is important particularly in semiconductor devices since they are of extremely long life and even slight migration can have an adverse effect on the devices as a whole. On the other hand, it has been found that by keeping within the limitations on the amount of additives the loss in electrical conductivity of the silver is very small. For example, an alloy according to the present invention containing 0.5% each of gold and platinum will have an electrical conductivity loss of 10% as compared with unalloyed silver. However, if 10% of platinum alone is used the conductivity of silver drops by more than 70%. At the same time the alloy of the present invention provides the desirable metal migration inhibition as well as being sufficiently flexible to make a good contact.

Furthermore, the wire used to make permanent connections across the terminals for use in electronic circuitry should establish permanent metallurgical bonds between the wire and the terminal. The wire must be capable of being bonded without damaging the terminals which are generally very brittle and delicate. This bonding is usually carried out by one of two means; namely thermocompression and ultrasonic bonding. The former requires the wire to be soft and low in compressive strength at moderate temperatures of from 200° to 400°C. Ultrasonic bonding is performed at ambient temperatures but the bonding surfaces themselves reach a very high temperature, normally about 30 to 50 % of the melt point of the metals being joined. These conditions place a severe limitation on the materials which can be used for these purposes.

It is, of course, highly desirable from a commercial standpoint to have a single alloy which will be suitable for both types of bonding. Clearly this permits numerous economies in the area of storage, shipping and handling. The alloy of the present invention meets all of these requirements while at the same time having thermal conductivity approaching that of silver. Moreover, since the alloy is almost entirely silver, the cost is a small fraction of that of gold.

In addition, it is possible to draw more wire out of the same weight of silver as can be obtained from gold due to the differences in specific gravities.

From the foregoing it can be seen that the alloys of the present invention, particularly when used as permanent connections for electronic terminals, produce unique and surprising results hitherto obtainable only with very expensive materials such as gold.

Only a limited number of embodiments of the present invention have been specifically described. It is nonetheless to be broadly construed and not to be limited except by the character of the claims appended hereto.

What is claimed is:

1. An alloy consisting essentially of silver, gold and platinum, there being from 0.1 to 0.5% by weight based on said alloy of each of said gold and said platinum.

* * * * *